United States Patent
Xia et al.

(10) Patent No.: US 9,405,867 B2
(45) Date of Patent: Aug. 2, 2016

(54) HYDRAULIC FRACTURE SIMULATION WITH AN EXTENDED FINITE ELEMENT METHOD

(75) Inventors: Lin Xia, Cumberland, RI (US); Zhen-Zhong Du, Barrington, RI (US); James Christopher Wohlever, Barrington, RI (US)

(73) Assignee: Dassault Systemes Simulia Corp., Johnston, RI (US)

( * ) Notice: Subject to any disclaimer, the term of this patent is extended or adjusted under 35 U.S.C. 154(b) by 945 days.

(21) Appl. No.: 13/491,164

(22) Filed: Jun. 7, 2012

(65) Prior Publication Data
US 2013/0332129 A1 Dec. 12, 2013

(51) Int. Cl.
| | |
|---|---|
| G06G 7/48 | (2006.01) |
| G06F 17/50 | (2006.01) |
| E21B 43/26 | (2006.01) |
| E21B 43/16 | (2006.01) |
| G01V 11/00 | (2006.01) |
| E21B 49/00 | (2006.01) |

(52) U.S. Cl.
CPC ............ *G06F 17/5018* (2013.01); *E21B 43/16* (2013.01); *E21B 43/26* (2013.01); *E21B 49/00* (2013.01); *G01V 11/00* (2013.01); *G01V 2210/66* (2013.01)

(58) Field of Classification Search
CPC .......................... G06F 2217/16; G06F 17/5018
USPC ........................................................... 703/9
See application file for complete search history.

(56) References Cited

U.S. PATENT DOCUMENTS

| | | | |
|---|---|---|---|
| 6,749,022 | B1 | 6/2004 | Fredd |
| 8,140,310 | B2 | 3/2012 | Fitzpatrick et al. |
| 2007/0272407 | A1 | 11/2007 | Lehman et al. |
| 2011/0120702 | A1 | 5/2011 | Craig |
| 2011/0120718 | A1 | 5/2011 | Craig |
| 2011/0125471 | A1 | 5/2011 | Craig et al. |
| 2011/0125476 | A1 | 5/2011 | Craig |

OTHER PUBLICATIONS

Lecampion, Brice. "An extended finite element method for hydraulic fracture problems." Communications in Numerical Methods in Engineering 25.2 (2009): 121-133 (corresponds to p. 1-13).*

"Abaqus analysis user's manual. Version 6.7" Simulia Corp. Providence, RI, USA (2007).*

Peirce, Anthony, and Emmanuel Detournay. "An implicit level set method for modeling hydraulically driven fractures." Computer Methods in Applied Mechanics and Engineering 197.33 (2008): 2858-2885.*

Sukumar, N., and J-H. Prévost. "Modeling quasi-static crack growth with the extended finite element method Part I: Computer implementation." International journal of solids and structures 40, No. 26 (2003): 7513-7537.*

(Continued)

*Primary Examiner* — Aniss Chad
(74) *Attorney, Agent, or Firm* — Hamilton, Brook, Smith & Reynolds, P.C.

(57) ABSTRACT

A computer-implemented method includes defining respective positions of a first set of nodes and a second set of nodes in an enrichment region, and performing a coupled pore fluid diffusion and stress analysis on the enrichment region at the first set of nodes. It is then determined whether the second set of nodes is activated—representing a fracture—as a result of the analysis, and the results are visually output to a user.

20 Claims, 6 Drawing Sheets

(56) References Cited

OTHER PUBLICATIONS

Daux et al. "Arbitrary branched and intersecting cracks with the extended finite element method." Int. J. Numer. Meth. Eng 48 (2000): 1741-1760.*

Belytschko, T., et al., "Elastic Crack Growth in Finite Elements With Minimal Remeshing," *International Journal for Numerical Methods in Engineering*, 45:601-620 (1999).

Carter, B.J., et al., "Simulating Fully 3D Hydraulic Fracturing," Cornell Fracture Group, *Modeling in Geomechanics* (2000).

Crittendon, Bob C., "The Mechanics of Design and Interpretation of Hydraulic Fracture Treatments," Journal of Petroleum Technology, pp. 21-29 (Oct. 1959).

Detournay, E., "The near-tip region of a fluid-driven fracture propagating in a permeable elastic solid," *J. Fluid Mech.* 494:1-32 (2003).

Hubert, M.K., et al., "Mechanics of Hydraulic Fracturing," *Petroleum Transactions, AIME*, 210:153-168 (Feb. 6, 1957).

Perkins, T.K., et al., "Widths of Hydraulic Fractures," *Journal of Petroleum Technology*, pp. 937-949 (Sep. 1961).

Yao, Y., et al., "Cohesive Fracture Mechanics Based Analysis to Model Ductile Rock Fracture," Paper presented at $44^{th}$ US Rock Mechanics Symposium and $5^{th}$ U.S.-Canada Rock Mechanics Symposium, Salt Lake City, UT, ARMA 2010 (Jun. 27-30, 2010).

\* cited by examiner

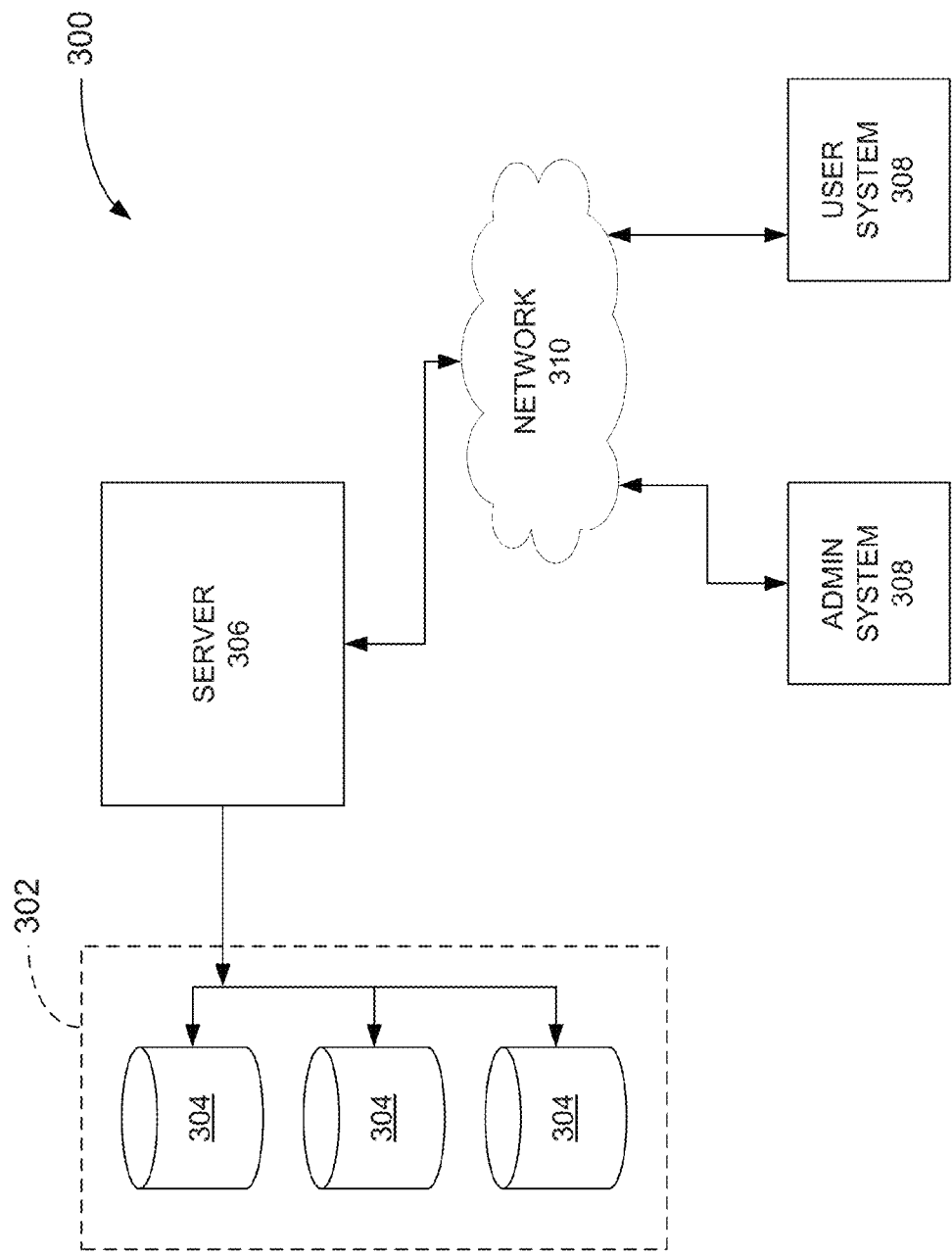

HYDRAULIC FRACTURE SIMULATION WITH AN EXTENDED FINITE ELEMENT METHOD

BACKGROUND OF THE INVENTION

The embodiments described herein relate generally to simulation modeling and, more particularly, to simulating hydraulic fracture in rocks and modeling fluid flow in the life sciences.

Hydraulic fracturing (commonly referred to as "fracking") is the process of initiation and propagation of an underground crack by pumping fluid at relatively high flow rates and pressures. Hydraulic fracturing is desired for a variety of reasons, including enhanced oil and gas recovery deep below the earth. Field data from hydraulic fracturing operations exist primarily in the form of pressure response curves. It is difficult to define the actual hydraulic fracture geometry from this data alone. Therefore, analytical solutions and numerical simulations are used to evaluate and predict the location, direction, and extent of these hydraulic fractures.

Early simplified theoretical models for hydraulic fracturing use an elasticity plane strain crack solution to establish the so-called PK model. Other attempted solutions have used significant amount of research to obtain analytical solutions for different cases. However, as the analytical model and the empirical approaches cannot handle fractures of arbitrary shape and orientations, a fully three-dimensional (3D) hydraulic fracture simulator is vital to the petroleum industry.

One such simulator is a fully-3D fracture analysis code, called FRANC3D, developed at Cornell University and based on remeshing and updating the boundary conditions for each stage of crack growth. However, FRANC3D is based on linear elastic fracture mechanics (LEFM), which generally gives reasonable predictions for hard (brittle) rock hydraulic fractures. However, for ductile rocks, such as clay or weakly consolidated sandstones (low cohesion granular material), LEFM-based methods typically give conservative predictions on fracture geometry because the ductile fracture process zone ahead of the crack is not considered. In addition, FRANC3D neglects the fluid continuity equation in the medium surrounding the fracture.

Some known simulation products use pore pressure cohesive zone model (CZM) to account for rock ductility (such as ductile shale) as well as fluid flow continuity. Such technology has been applied to predict hydraulic fracturing with different rock properties for injection wells by oil and gas companies. However, the crack path has to be predefined or be aligned with the element edge when using the pore pressure cohesive elements.

Accordingly, modeling hydraulic fracture requires that the crack initiates and propagates along an arbitrary, solution-dependent path. One drawback of conventional methods is that mesh is required to conform to the geometric discontinuities. Modeling a growing crack is more cumbersome because the mesh must be updated continuously to match geometry of the discontinuity as the crack progress. Moreover, using cohesive elements is limited in that cohesive elements must align with underlying element boundaries and the cracks propagate along a set of predefined paths.

BRIEF DESCRIPTION OF THE INVENTION

In one aspect, a computer-implemented method includes defining respective positions of a first set of nodes and a second set of nodes in an enrichment region, and performing a coupled pore fluid diffusion and stress analysis on the enrichment region at the first set of nodes. It is then determined whether the second set of nodes is activated as a result of the analysis, and the results are visually output to a user.

In another aspect, a computer includes a memory area configured to store respective positions of a first set of nodes and a second set of nodes in an enrichment region. The computer also includes a processor coupled to the memory area and configured to perform a coupled pore fluid diffusion and stress analysis on the enrichment region at the first set of nodes, determine whether the second set of nodes is activated as a result of the analysis, and visually output the results to a user.

In another aspect, a computer program product includes one or more non-transitory computer-readable storage media having computer-executable components thereon. The computer-executable components include a definition component that when executed by a processor causes the processor to define respective positions of a first set of nodes and a second set of nodes in an enrichment region. The computer-executable components also include an analysis component that a processor to perform a coupled pore fluid diffusion and stress analysis on the enrichment region at the first set of nodes, determine whether the second set of nodes is activated as a result of the analysis, and visually output the results to a user.

BRIEF DESCRIPTION OF THE DRAWINGS

The details of one or more embodiments of the invention are set forth in the accompanying drawings and the description that follows. Other features, objects, and advantages of the invention will be apparent from the description and drawings, and from the claims.

FIG. 3 is a schematic block diagram of an exemplary computer network for use in performing the embodiments described herein.

DETAILED DESCRIPTION OF THE INVENTION

The embodiments described herein relate to an extended finite element method (XFEM) that alleviates the above-described shortcomings associated with meshing crack surfaces. These embodiments are based in on the concept of partition of unity, which allows local enrichment functions to be easily incorporated into a finite element approximation. The presence of discontinuities is ensured by the special enriched functions in conjunction with additional degrees of freedom. However, one advantage of the embodiments described herein is that these embodiments do not require the mesh to match the geometry of the discontinuities. Accordingly, the embodiments described herein provide a very attractive and effective way to simulate initiation and propagation of a discrete crack along an arbitrary, solution-dependent path without the requirement of remeshing.

Moreover, the embodiments described herein include the pore-pressure field for hydraulic fracture analysis. Specifically, additional phantom nodes with pore pressure degrees of freedom are introduced on the edges of each enriched element. The phantom node at each element edge is not activated until the edge is intersected by a crack. The fluid is assumed to be incompressible. The fluid flow continuity, which accounts for both tangential and normal flow, including fluid leakoff, within and across the cracked element surfaces as well as the rate of opening of the cracked element surfaces, is maintained. The fluid pressure on the cracked element surfaces contributes to the traction-separation behavior of the cohesive segments in the enriched elements, which enables the modeling of hydraulically driven fracture.

One advantage of the embodiments described herein over previous attempts to effectively model hydraulic fracture analysis is that the embodiments described herein do not require the mesh to match the geometry of the discontinuities. This numerical technique is a very attractive and effective way to simulate initiation and propagation of a discrete crack along an arbitrary, solution-dependent path without the requirement of remeshing. It is based on cohesive segments method in conjunction with phantom nodes. This enables the modeling of discontinuities in the fluid pressure field as well as fluid flow within the cracked element surfaces as in hydraulically driven fracture.

Figure 1:
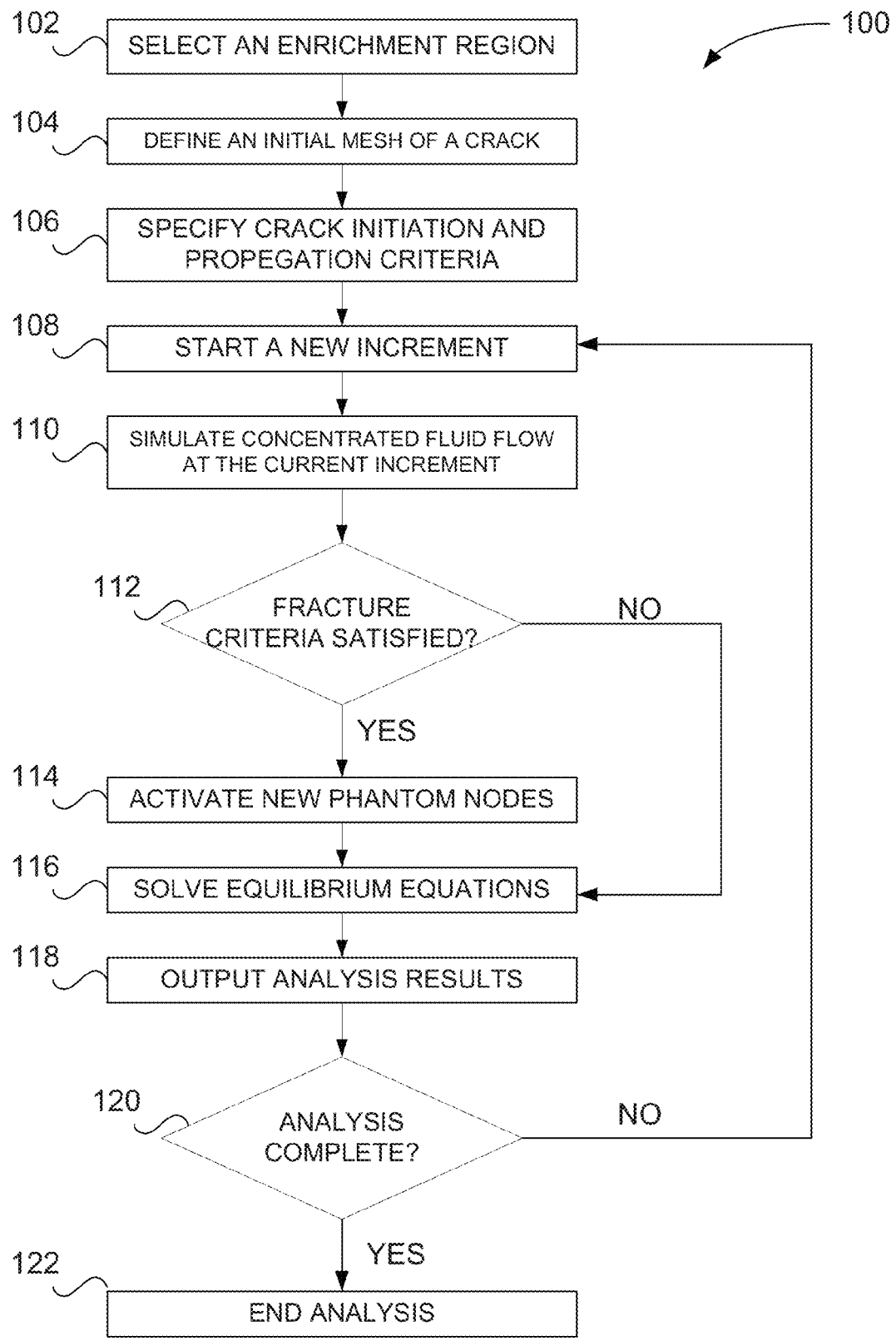
FIG. 1 is a flowchart that illustrates an exemplary method for simulating hydraulic fracture simulation using extended finite element method (XFEM).

FIG. 1 is a flowchart 100 that illustrates an exemplary method for simulating hydraulic fracture simulation using extended finite element method (XFEM) with pore pressure degrees of freedom. Specifically, the method illustrated in FIG. 1 uses XFEM with pore pressure degrees of freedom. Modeling stationary discontinuities, such as a crack, with conventional finite element methods requires that the mesh conforms to the geometric discontinuities. Therefore, considerable mesh refinement is needed in the neighborhood of the crack tip to capture the singular asymptotic fields adequately. Modeling a growing crack is even more cumbersome because the mesh must be updated continuously to match the geometry of the discontinuity as the crack progresses. The XFEM process alleviates the shortcomings associated with meshing crack surfaces. The presence of discontinuities is ensured by the special enriched functions in conjunction with additional degrees of freedom. However, the finite element framework and its properties such as sparsity and symmetry are retained.

For the purpose of fracture analysis, the enrichment functions typically consist of the near-tip asymptotic functions that capture the singularity around the crack tip and a discontinuous function that represents the jump in displacement across the crack surfaces. The approximation for a displacement vector function u with the partition of unity enrichment is shown in Equation (1):

$$u = \sum_{I=1}^{N} N_I(x)[u_I + H(x)a_I + \sum_{\alpha=1}^{4} F_\alpha(x) b_I^\alpha] \quad \text{Eq. (1)}$$

where $N_I(x)$ are the usual nodal shape functions; the first term on the right-hand side of Equation (1), $u_I$, is the usual nodal displacement vector associated with the continuous part of the finite element solution; the second term is the product of the nodal enriched degree of freedom vector, $a_I$, and the associated discontinuous jump function $H(x)$ across the crack surfaces; and the third term is the product of the nodal enriched degree of freedom vector, $b_I$, and the associated elastic asymptotic crack-tip functions, $F_\alpha(x)$. The first term on the right-hand side is applicable to all the nodes in the model; the second term is valid for nodes whose shape function support is cut by the crack interior; and the third term is used only for nodes whose shape function support is cut by the crack tip.

Figure 2A:
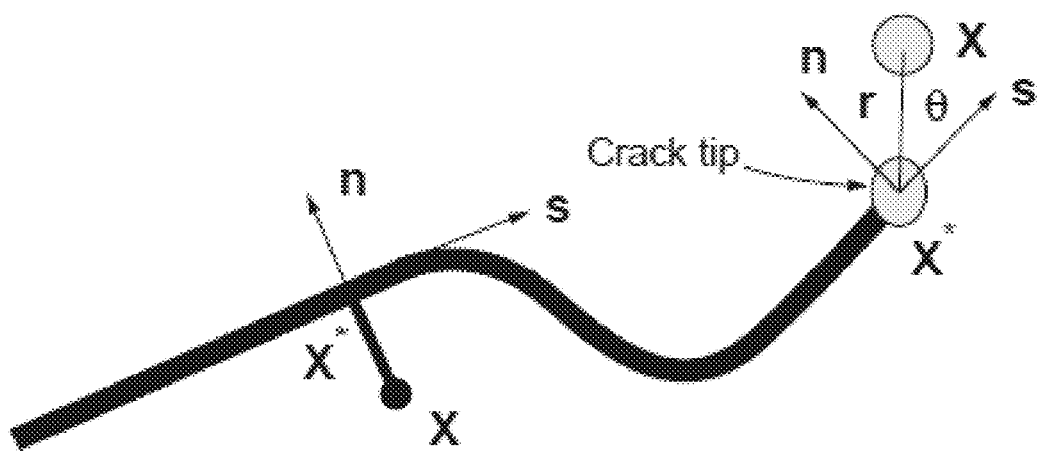
FIGS. 2A-2D are diagrams illustrating fluid flow properties within an enrichment region as described in the flowchart of FIG. 1.

FIG. 2A illustrates the discontinuous jump function across the crack surfaces, H(x), which is given by Equation (2):

$$H(x) = \begin{cases} 1 & \text{if } (x - x^*) \cdot n \geq 0 \\ -1 & \text{otherwise} \end{cases} \quad \text{Eq. (2)}$$

where x is a sample (Gauss) point, x* is the point on the crack closest to x, and n is the unit outward normal to the crack at x*. Moreover, FIG. 2A illustrates the asymptotic crack tip functions in an isotropic elastic material, $F_\alpha(x)$, which are given by Equation (3):

$$F_\alpha(x) = \left[ \sqrt{r}\sin\frac{\theta}{2},\ \sqrt{r}\cos\frac{\theta}{2},\ \sqrt{r}\sin\theta\sin\frac{\theta}{2},\ \sqrt{r}\sin\theta\cos\frac{\theta}{2} \right] \quad \text{Eq. (3)}$$

where $(r, \theta)$ is a polar coordinate system with its origin at the crack tip and $\theta=0$ is tangent to the crack at the tip.

These functions span the asymptotic crack-tip function of elasto-statics, and $$\sqrt{r}\sin\frac{\theta}{2}$$

takes into account the discontinuity across the crack face. The use of asymptotic crack-tip functions is not restricted to crack modeling in an isotropic elastic material. The same approach can be used to represent a crack along a bimaterial interface, impinged on the bimaterial interface, or in an elastic-plastic power law hardening material. However, in each of these three cases different forms of asymptotic crack-tip functions are required depending on the crack location and the extent of the inelastic material deformation. Accurately modeling the crack-tip singularity requires constantly keeping track of where the crack propagates and is cumbersome because the degree of crack singularity depends on the location of the crack in a non-isotropic material. While modeling propagating cracks, one can assume that the crack propagates across an entire element in a single increment, which allows the invention to avoid the complexities associated with the crack tip asymptotic fields.

Referring to FIG. 1, and in an exemplary embodiment, a user selects 102 an enrichment region to be analyzed and specifies its properties. One or multiple pre-existing cracks can be associated with an enriched feature. In addition, during an analysis one or more cracks can initiate in an enriched feature without any initial defects. However, in general, multiple cracks can nucleate in a single enriched feature only when the damage initiation criterion is satisfied in multiple elements in the same time increment. Otherwise, additional cracks will not nucleate until all the pre-existing cracks in an enriched feature have propagated through the boundary of the given enriched feature. If several crack nucleations are expected to occur at different locations sequentially during an analysis, multiple enriched features can be specified in the model. Enriched degrees of freedom are activated when an element is intersected by a crack. Only stress/displacement or displacement/pore pressure solid continuum elements can be associated with an enriched feature.

Figure 2B:
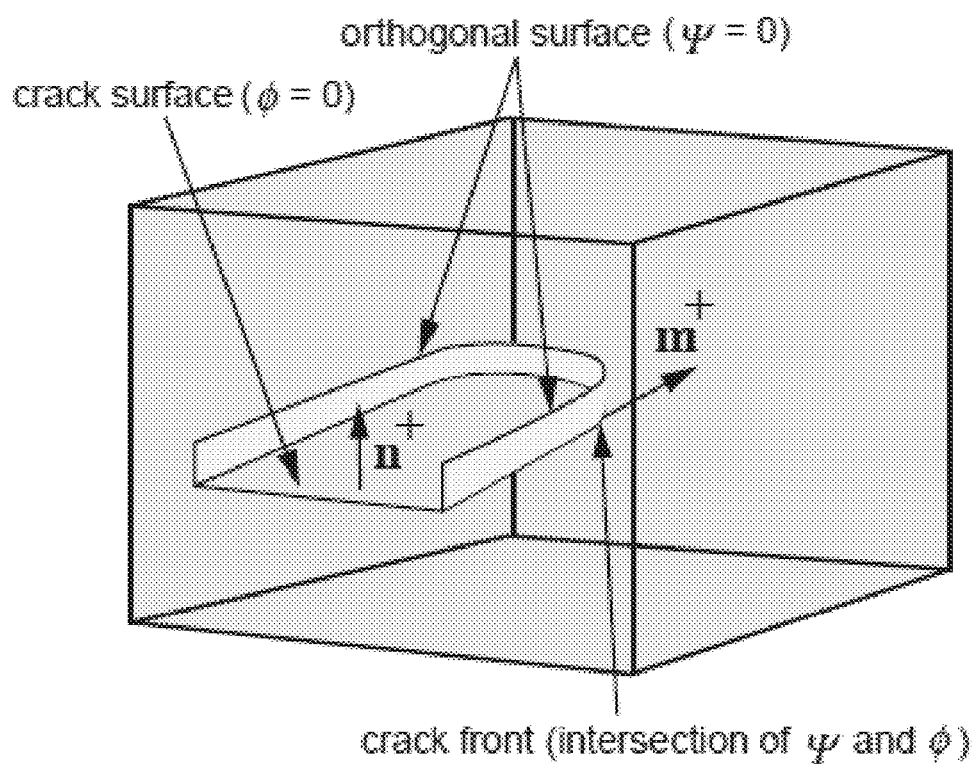

The user then defines 104 an initial crack within the selected enrichment region. In an exemplary embodiment, the initial crack is defined using level node sets. The user then specifies 106 crack initiation and propagation criteria. As noted above, the embodiments described herein facilitate treatment of cracks in an extended finite element analysis in describing of crack geometry, because the mesh is not required to conform to the crack geometry. The level set method, which is a powerful numerical technique for analyzing and computing interface motion, fits naturally with the extended finite element method and makes it possible to model arbitrary crack growth without remeshing. The crack geometry is defined by two almost-orthogonal signed distance functions, as illustrated in FIG. 2B. The first, $\phi$, describes the crack surface, while the second, $\psi$, is used to construct an orthogonal surface so that the intersection of the two surfaces gives the crack front. $n^+$ indicates the positive normal to the crack surface; and $m^+$ indicates the positive normal to the crack front. No explicit representation of the boundaries or interfaces is needed because they are entirely described by the nodal data. Two signed distance functions per node are generally required to describe a crack geometry.

When defining the initial crack, the user chooses whether to model an arbitrary stationary crack or a discrete crack propagating along an arbitrary, solution-dependent path. The former requires that the elements around the crack tips are enriched with asymptotic functions to catch the singularity and that the elements intersected by the crack interior are enriched with the jump function across the crack surfaces. The latter infers that crack propagation is modeled with either the cohesive segments method or the linear elastic fracture mechanics approach in conjunction with phantom nodes. However, the options are mutually exclusive and cannot be specified simultaneously in a model. The user also associates the enrichment definition with a region of the model. Only degrees of freedom in elements within these regions are potentially enriched with special functions. The region should consist of elements that are presently intersected by cracks and those that are likely to be intersected by cracks as the cracks propagate.

In response to the user inputs, a computer creates phantom nodes on top of each real node and along each element edge. When an element is cut by a crack, the compressive behavior of the crack surfaces is considered during analysis. The formulae that govern the behavior are very similar to those used for surface-based small-sliding penalty contact. For an element intersected by a stationary crack or a moving crack with the linear elastic fracture mechanics approach, it is assumed that the elastic cohesive strength of the cracked element is zero. Therefore, compressive behavior of the crack surfaces is fully defined with the above options when the crack surfaces come into contact. For a moving crack with the cohesive segments method, the situation is more complex; traction-separation cohesive behavior and compressive behavior of the crack surfaces are involved in a cracked element. In the contact normal direction, the pressure-overclosure relationship governing the compressive behavior between the surfaces does not interact with the cohesive behavior, since they each describe the interaction between the surfaces in a different contact regime. The pressure-overclosure relationship governs the behavior only when the crack is "closed"; the cohesive behavior contributes to the contact normal stress only when the crack is "open" (i.e., not in contact). If the elastic cohesive stiffness of an element is undamaged in the shear direction, it is assumed that the cohesive behavior is active. Any tangential slip is assumed to be purely elastic in nature and is resisted by the elastic cohesive strength of the element, resulting in shear forces. If damage has been defined, the cohesive contribution to the shear stresses starts degrading with damage evolution. Once maximum degradation has been reached, the cohesive contribution to the shear stresses is zero. The friction model activates and begins contributing to the shear stresses, if it is defined.

Figure 2C:
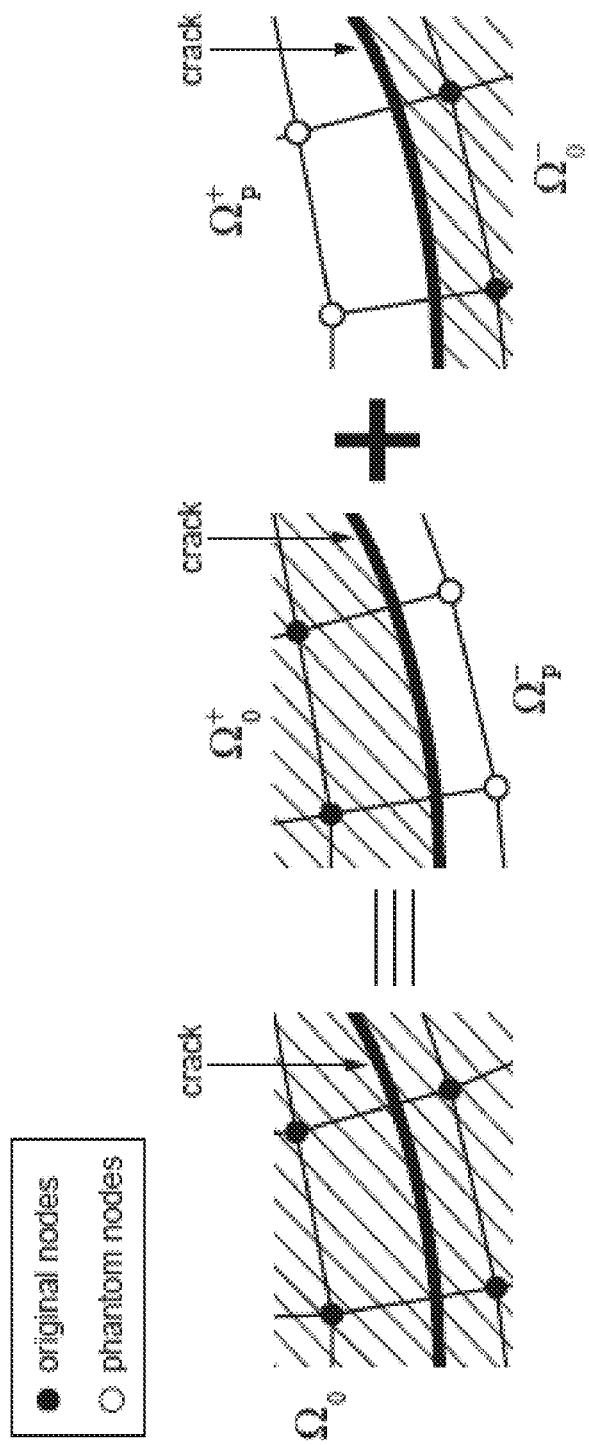

Phantom nodes, which are superposed on the original real nodes, represent the discontinuity of the cracked elements, as illustrated in FIG. 2C. When the element is intact, each phantom node is completely constrained to its corresponding real node. When the element is cut through by a crack, the cracked element splits into two parts. Each part is formed by a combination of some real and phantom nodes depending on the orientation of the crack. Each phantom node and its corresponding real node are no longer tied together and can move apart. The magnitude of the crack surface separation is governed by the cohesive law until the cohesive strength of the cracked element is zero, after which the two parts move independently. To have a set of full interpolation bases, the part of the cracked element that belongs in the real domain, $\Omega_0$, is extended to the phantom domain, $\Omega_p$. Then the displacement in the real domain, $\Omega_0$, can be interpolated by using the degrees of freedom for the nodes in the phantom domain, $\Omega_p$. The jump in the displacement field is realized by simply integrating only over the area from the side of the real nodes up to the crack; i.e., $\Omega_0^+$ and $\Omega_0^-$.

In some embodiments, the cohesive segments method in conjunction with phantom nodes discussed above are extended to model hydraulically driven fracture. In this case additional phantom nodes with pore pressure degrees of freedom are introduced on the edges of each enriched element to model the fluid flow within the cracked element surfaces in conjunction with the phantom nodes that are superposed on the original real nodes to represent the discontinuities of displacement and fluid pressure in a cracked element. The phantom node at each element edge is not activated until the edge is intersected by a crack.

Figure 2D:
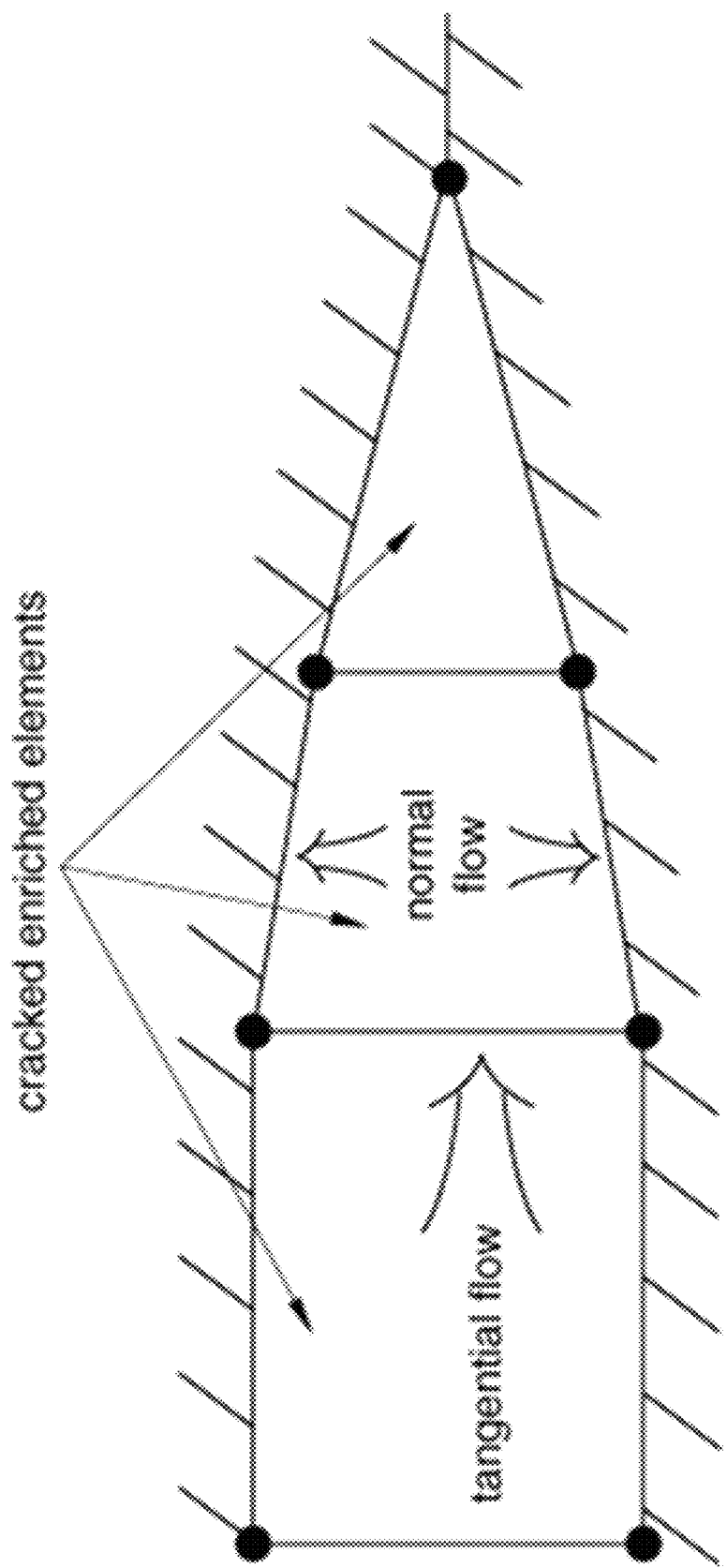

The flow patterns of the pore fluid in the cracked elements are shown in FIG. 2D. The fluid is assumed to be incompressible. The fluid flow continuity, which accounts for both tangential and normal flow within and across the cracked element surfaces as well as the rate of opening of the cracked element surfaces, is maintained. The fluid pressure on the cracked element surfaces contributes to the traction-separation behavior of the cohesive segments in the enriched elements, which enables the modeling of hydraulically driven fracture.

Referring again to FIG. 1, and in an exemplary embodiment, a new increment is examined 108. In each increment, concentrated fluid flow is simulated 110 through the enrichment region. Simulating the fluid flow through an enrichment region having one or more cracks enables the user to determine how the enrichment region will be damaged by the loads imparted by the fluid. For example, damage modeling enables simulation of the degradation and eventual failure of an enriched element. The failure mechanism consists of two ingredients: a damage initiation criterion and a damage evolution law. The initial response is assumed to be linear as discussed above. However, once a damage or fracture initiation criterion is met 112, damage can occur according to a user-defined damage evolution law. The enriched elements do not undergo damage under pure compression. Damage of the traction-separation response for cohesive behavior in an enriched element is defined within the same general framework used for conventional materials. However, unlike cohesive elements with traction-separation behavior, the user does not need to specify the undamaged traction-separation behavior in an enriched element.

In determining whether the fracture criteria is satisfied, one variable is crack initiation, which refers to the beginning of degradation of the cohesive response at an enriched element. The process of degradation begins when the stresses or the strains satisfy specified crack initiation criteria. Crack initiation criteria include, but are not limited to, a maximum principal stress criterion, a maximum principal strain criterion, a maximum nominal stress criterion, a maximum nominal strain criterion, a quadratic traction-interaction criterion, a quadratic separation-interaction criterion, and a user-defined damage initiation criterion. The user may also specify a tolerance such that, when one or more of the fracture criteria exceeds the tolerance, a new crack is introduced.

The maximum principal stress criterion can be represented as shown in Equation (4):

$$f = \left\{ \frac{\langle \sigma_{max} \rangle}{\sigma_{max}^o} \right\} \quad \text{Eq. (4)}$$

where $\sigma_{max}^o$ represents the maximum allowable principal stress. The symbol $\langle \rangle$ represents the Macaulay bracket with the usual interpretation (i.e., $\langle \sigma_{max} \rangle = 0$ if $\sigma_{max} < 0$ and $\langle \sigma_{max} \rangle = \langle \sigma_{max} \rangle$ if $\sigma_{max} \geq 0$). The Macaulay brackets are used to signify that a purely compressive stress state does not initiate damage. Damage is assumed to initiate when the maximum principal stress ratio (as defined in the expression above) reaches a value of one.

The maximum principal strain criterion can be represented as shown in Equation (5):

$$f = \left\{ \frac{\langle \varepsilon_{max} \rangle}{\varepsilon_{max}^o} \right\} \quad \text{Eq. (5)}$$

where $\varepsilon_{max}^o$ represents the maximum allowable principal strain, and the Macaulay brackets signify that a purely compressive strain does not initiate damage. Damage is assumed to initiate when the maximum principal strain ratio (as defined in the expression above) reaches a value of one.

The maximum nominal stress criterion can be represented as shown in Equation (6):

$$f = \max\left\{ \frac{\langle t_n \rangle}{t_n^o}, \frac{t_s}{t_s^o}, \frac{t_t}{t_t^o} \right\} \quad \text{Eq. (6)}$$

Here, the nominal traction stress vector, t, consists of three components (two in two-dimensional problems). $t_n$ is the component normal to the likely cracked surface, and $t_s$ and $t_t$ are the two shear components on the likely cracked surface. Depending on what is specified by the user, the likely cracked surface will be orthogonal either to the element local 1-direction or to the element local 2-direction. Here, $t_n^o$, $t_s^o$, and $t_t^o$ represent the peak values of the nominal stress. The $\langle \rangle$ symbol represents the Macaulay bracket with the usual interpretation. The Macaulay brackets are used to signify that a purely compressive stress state does not initiate damage. Damage is assumed to initiate when the maximum nominal stress ratio (as defined in the expression above) reaches a value of one.

The maximum nominal strain criterion can be represented as shown in Equation (7):

$$f = \max\left\{ \frac{\langle \varepsilon_n \rangle}{\varepsilon_n^o}, \frac{\varepsilon_s}{\varepsilon_s^o}, \frac{\varepsilon_t}{\varepsilon_t^o} \right\} \quad \text{Eq. (7)}$$

Here, damage is assumed to initiate when the maximum nominal strain ratio (as defined in the expression above) reaches a value of one.

The quadratic nominal stress criterion can be represented as shown in Equation (8):

$$f = \left\{ \frac{\langle t_n \rangle}{t_n^o} \right\}^2 + \left\{ \frac{t_s}{t_s^o} \right\}^2 + \left\{ \frac{t_t}{t_t^o} \right\}^2 \quad \text{Eq. (8)}$$

Here, damage is assumed to initiate when the quadratic interaction function involving the stress ratios (as defined in the expression above) reaches a value of one.

The quadratic nominal strain criterion can be represented as shown in Equation (9):

$$f = \left\{ \frac{\langle \varepsilon_n \rangle}{\varepsilon_n^o} \right\}^2 + \left\{ \frac{\varepsilon_s}{\varepsilon_s^o} \right\}^2 + \left\{ \frac{\varepsilon_t}{\varepsilon_t^o} \right\}^2 \quad \text{Eq. (9)}$$

Here, damage is assumed to initiate when the quadratic interaction function involving the nominal strain ratios (as defined in the expression above) reaches a value of one.

If the one or more fracture criteria are satisfied (YES at step 112), new phantom nodes are activated 114. Specifically, if the one or more fracture criteria are satisfied then the computer determines that a specific phantom node and its corresponding real node are no longer tied together, i.e., the two nodes no longer have the same coordinates or no longer occupy the same space within the enrichment region. The magnitude of the crack surface separation is governed by the cohesive law. Moreover, additional phantom nodes at the enrichment region's edges are activated 114 with pore pressure degrees of freedom. This ensures fluid flow continuity within or along the surfaces of the enrichment region. If the one or more fracture criteria are not satisfied (NO at step 112), the phantom nodes are not activated.

In an exemplary embodiment, one or more equilibrium equations are then solved 116 by the computer, regardless of whether the phantom nodes were activated. Viscous regularization of the constitutive equations defining cohesive behavior in an enriched element may be used to overcome some of convergence difficulties. Viscous regularization damping causes the tangent stiffness matrix to be positive definite for sufficiently small time increments. The tangential flow within the cracked element surfaces can be modeled with either a Newtonian or power-law model. By default, there is no tangential flow of pore fluid within the cracked element surfaces. To allow tangential flow, the user defines a gap flow property in conjunction with the pore fluid material definition. In the case of a Newtonian fluid the volume flow rate density vector is given by Equation (10):

$$q_d = -k_t \nabla p \quad \text{Eq. (10)}$$

where $k_t$ is the tangential permeability (the resistance to the fluid flow), $\nabla p$ is the pressure gradient along the cracked element surfaces, and d is the opening of the cracked element surfaces. The tangential permeability, or the resistance to flow, can be defined according to Reynold's equation, shown as Equation (11):

$$k_t = \frac{d^3}{12\mu}$$ Eq. (11)

where μ is the fluid viscosity and d is the opening of the cracked element surfaces. An upper limit on the value of $k_t$ may also be specified. In the case of a power law fluid the constitutive relation is defined as shown in Equation (12):

$$\tau = K\dot{\gamma}^\alpha$$ Eq. (12)

where τ is the shear stress, $\dot{\gamma}$ is the shear strain rate, K is the fluid consistency, and α is the power law coefficient. Accordingly, the tangential volume flow rate density is defined as shown in Equation (13):

$$q_d = -\left(\frac{2\alpha}{1+2\alpha}\right)\left(\frac{1}{K}\right)^{\frac{1}{\alpha}}\left(\frac{d}{2}\right)^{\frac{1+2\alpha}{\alpha}}\|\nabla p\|^{\frac{1-\alpha}{\alpha}}\nabla p$$ Eq. (13)

where d is the opening of the cracked element surfaces.

As another example, and for normal flow across the cracked element surfaces, a fluid leakoff coefficient is defined for the pore fluid material. This coefficient defines a pressure-flow relationship between the phantom nodes located at the cracked element edges and cracked element surfaces. The fluid leakoff coefficients can be interpreted as the permeability of a finite layer of material on the cracked element surfaces. The normal flow is defined as shown in Equations (14) and (15):

$$q_t = c_t(p_i - p_t)$$ Eq. (14)

$$q_b = c_b(p_i - p_b)$$ Eq. (15)

where $q_t$ and $q_b$ are the flow rates into the top and bottom surfaces of a cracked element, respectively; $p_i$ is the pressure at the phantom node located at the cracked element edge; and $p_t$ and $p_b$ are the pore pressures on the top and bottom surfaces of a cracked element, respectively. Leakoff coefficients may also be defined as functions of temperature and field variables.

The output results of the equilibrium equations are presented 118 to a user. In an exemplary embodiment, the results are visually output to a user via, for example, a display device. After, or during, presentation 118 of the results, it is determined 120 whether analysis is complete. For example, a computer determines 120 whether there are remaining increments to be examined 110. If analysis is not complete (NO at step 120), the process starts 108 a new increment and performs the proceeding steps 110, 112, 114, 116, and 118. If analysis is complete (YES at step 120), meaning that each increment has been examined, then the process ends 122.

FIG. 3 is a schematic block diagram of an exemplary computer network 300 for use in simulating hydraulic fracture simulation using an XFEM with pore pressure degrees of freedom method, and/or for use in performing the processes described above and/or additional processes that may be related to those described above. In an exemplary embodiment, a memory area 302 includes one or more storage devices 304 for use in storing data, such as material fracture properties, enrichment region properties, real and phantom node coordinates, fracture criteria for an enrichment region, mesh data for an enrichment region and/or crack regions, fluid flow data, equilibrium equations and associated data, or any other suitable data. In some embodiments, the memory area 302 is coupled to a server system 306, which is in turn coupled to client systems 308 such as an administrator system and/or a user system, via a network 310. The storage devices 304 may be embodied as one or more databases, may be located at a single or at multiple geographical sites, or may be integrated with the server system 306.

As can be appreciated, the network 310 can be a public network, such as the Internet, or a private network such as an LAN or WAN network, or any combination thereof and can also include PSTN or ISDN sub-networks. The network 310 can also be wired, such as an Ethernet network, or can be wireless such as a cellular network including EDGE, 3G, and 4G wireless cellular systems. The wireless network can also be WiFi, Bluetooth, or any other wireless form of communication that is known. Thus, the network 310 is merely exemplary and in no way limits the scope of the present advancements.

The client systems 308 can be any suitable computer architecture such as the one described below with reference to FIG. 4, or any other computing architecture that is known. Moreover, it should be understood that the server system 306 is configured to perform the processes described above and/or any additional processes that may be related to those described above.

The server system 306 stores the computer-readable instructions to execute the processes described above, and provides these instructions via the network 310 to the client systems 308. Moreover, the server system 306 can also provide data from the memory area 302 as needed to the client systems 308 such that the client systems 308 execute the processes described above. As such, FIG. 3 includes implementations of the computer system 300 via cloud computing, distributed computing, and the like.

During operation, the server system 306 and the client systems 308 interact to perform the steps described above in FIG. 1. For example, data may be entered by a user into a client system 308 and transmitted to the server system 306 via the network 310. The data may then be stored in the memory area 302 and accessed as necessary by the server system 306 and/or a client system 308. In some embodiments, the server system 306 performs the analysis steps described above, such as simulation of concentrated fluid flows through an enrichment region, determining whether one or more fracture criteria within the enrichment region are satisfied, activating phantom nodes as necessary if the fracture criteria are satisfied, solving equilibrium equations, and transmitting analysis results to a client system 308 for presentation to the user. In addition to presenting the analysis results, the client system 308 may be used by a user to select the enrichment region to be analyzed, define an initial mesh of a crack within the enrichment region, and specify crack initiation and propagation criteria. The client system 308 transmits this data to the server system 308 for use in analyzing crack initiation and propagation problems within the enrichment region.

Figure 4:
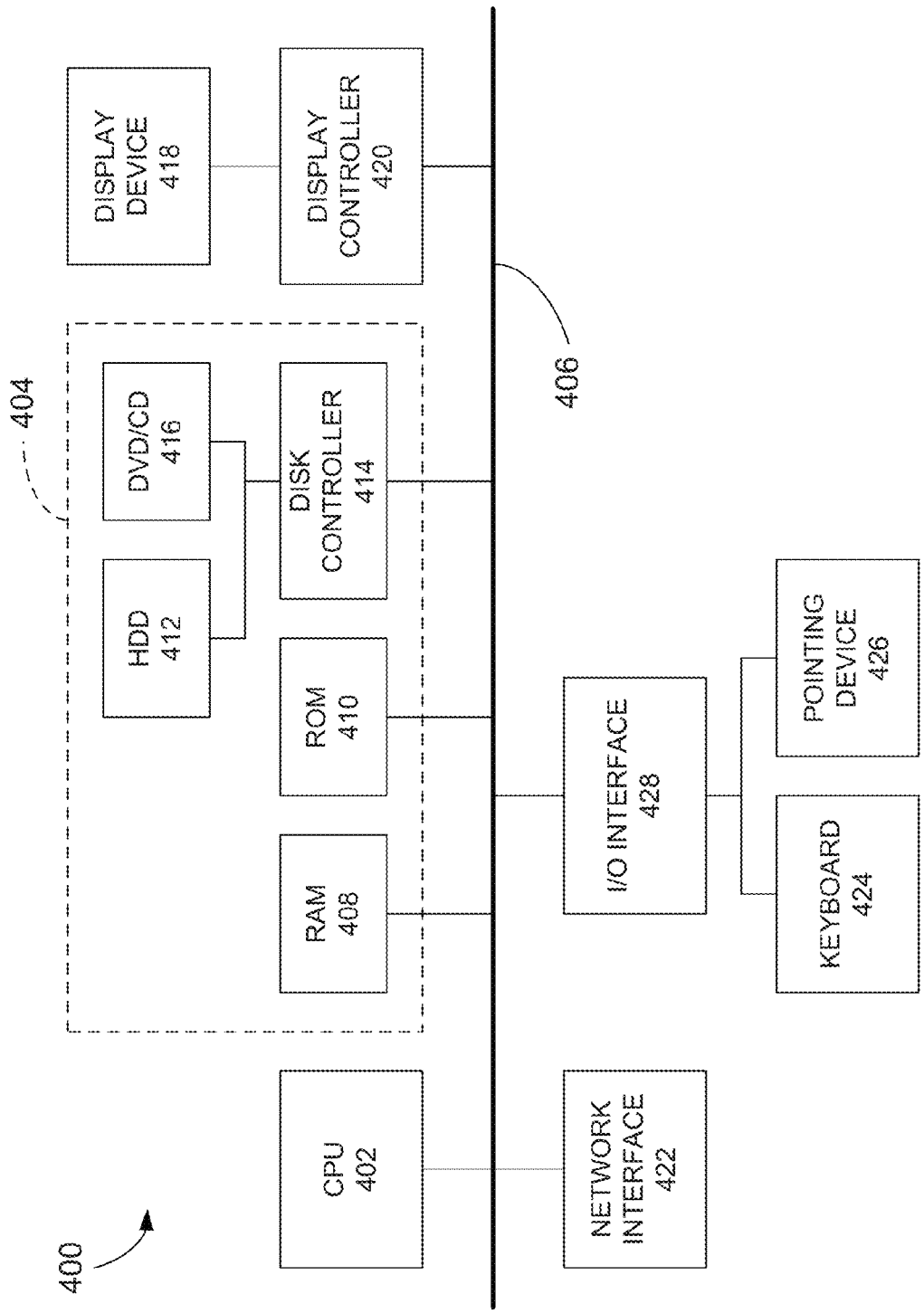
FIG. 4 is a schematic block diagram of an exemplary computer architecture for use with the computer devices shown in FIG. 3.

FIG. 4 is a schematic block diagram of an exemplary computer architecture 400 for use with the server system 306 and/or the client systems 308 (each shown in FIG. 3).

In an exemplary embodiment, the computer architecture 400 includes one or more processors 402 (CPU) that performs the processes described above and/or any additional processes that may be related to those described above. It should be understood that the term "processor" refers generally to any programmable system including systems and microcontrollers, reduced instruction set circuits (RISC), application-specific integrated circuits (ASIC), programmable logic circuits, and/or any other circuit or processor capable of executing the functions described herein. The above examples are exemplary only and, thus, are not intended to limit in any way the definition and/or meaning of the term "processor."

The steps of the processes described above and/or any additional processes that may be related to those described above may be stored as computer-executable instructions in, for example, a memory area 404 that is operably and/or communicatively coupled to the processor 402 by a system bus 406. A "memory area," as used herein, refers generally to any means of storing non-transitory program code and instructions executable by one or more processors to aid in simulating hydraulic fracture simulation using an XFEM with pore pressure degrees of freedom method, and/or for use in performing the processes described above and/or additional processes that may be related to those described above. The memory area 404 may include one, or more than one, forms of memory. For example, the memory area 404 may include random-access memory (RAM) 408, which can include non-volatile RAM, magnetic RAM, ferroelectric RAM, and/or other forms of RAM. The memory area 404 may also include read-only memory (ROM) 410 and/or flash memory and/or electrically-programmable read-only memory (EEPROM). Any other suitable magnetic, optical, and/or semiconductor memory, such as a hard-disk drive (HDD) 412, by itself or in combination with other forms of memory, may be included in the memory area 404. The HDD 412 may also be coupled to a disk controller 414 for use in transmitting and receiving messages to and from the processor 402. Moreover, the memory area 404 may also be, or may include, a detachable or removable memory 416, such as a suitable cartridge disk, CD-ROM, DVD, or USB memory. The above examples are exemplary only and, thus, are not intended to limit in any way the definition and/or meaning of the term "memory area."

The computer architecture 400 also includes a display device 418 that is coupled, such as operatively coupled, to a display controller 420. The display controller 420 receives data via the system bus 406 for display by the display device 418. The display device 418 may be, without limitation, a monitor, a television display, a plasma display, a liquid crystal display (LCD), a display based on light-emitting diodes (LED), a display based on organic LEDs (OLED), a display based on polymer LEDs, a display based on surface-conduction electron emitters, a display including a projected and/or reflected image, or any other suitable electronic device or display mechanism. Moreover, the display device 418 may include a touchscreen with an associated touchscreen controller 420. The above examples are exemplary only and, thus, are not intended to limit in any way the definition and/or meaning of the term "display device."

In addition, the computer architecture 400 includes a network interface 422 for use in communicating with a network (not shown in FIG. 4). Moreover, the computer architecture 400 includes one or more input devices, such as a keyboard 424 and/or a pointing device 426, such as a roller ball, mouse, touchpad, and the like. The input devices are coupled to and controlled by an input/output (I/O) interface 428, which is further coupled to the system bus 406.

A description of the general features and functionality of the display device 418, keyboard 424, pointing device 426, as well as the display controller 420, disk controller 414, network interface 422, and I/O interface 428 is omitted herein for brevity as these features are known.

During operation, the processor 402 performs the steps described above in FIG. 1. For example, data may be entered by a user via the keyboard 424 and/or the pointing device 426. The data may then be stored in the memory area 404 and accessed as necessary by the processor 402. In some embodiments, the processor 402 performs the analysis steps described above, such as simulation of concentrated fluid flows through an enrichment region, determining whether one or more fracture criteria within the enrichment region are satisfied, activating phantom nodes as necessary if the fracture criteria are satisfied, solving equilibrium equations, and causing the display device 418 to display the analysis results to the user. In addition to presenting the analysis results, the processor 402 may select the enrichment region to be analyzed, define an initial mesh of a crack within the enrichment region, and specify crack initiation and propagation criteria, all based on user inputs via the keyboard 424 and/or the pointing device 426.

Exemplary embodiments of systems, methods, apparatus, and computer-program products for use in simulating or modeling fluid flow within and between solid bodies are described above in detail. The systems, methods, apparatus, and computer-program products are not limited to the specific embodiments described herein but, rather, operations of the methods and/or components of the system and/or apparatus may be utilized independently and separately from other operations and/or components described herein. Further, the described operations and/or components may also be defined in, or used in combination with, other systems, methods, and/or apparatus, and are not limited to practice with only the systems, methods, and storage media as described herein.

Although the present invention is described in connection with an exemplary simulation system environment, embodiments of the invention are operational with numerous other general purpose or special purpose simulation system environments or configurations. The simulation system environment is not intended to suggest any limitation as to the scope of use or functionality of any aspect of the invention. Moreover, the simulation system environment should not be interpreted as having any dependency or requirement relating to any one or combination of components illustrated in the exemplary operating environment. Examples of well known simulation systems, environments, and/or configurations that may be suitable for use with aspects of the invention include, but are not limited to, personal computers, server computers, hand-held or laptop devices, multiprocessor systems, microprocessor-based systems, set top boxes, programmable consumer electronics, mobile telephones, network PCs, mini-computers, mainframe computers, distributed computing environments that include any of the above systems or devices, and the like.

Embodiments of the invention may be described in the general context of computer-executable instructions, such as program components or modules, executed by one or more computers or other devices. Aspects of the invention may be implemented with any number and organization of components or modules. For example, aspects of the invention are not limited to the specific computer-executable instructions or the specific components or modules illustrated in the figures and described herein. Alternative embodiments of the invention may include different computer-executable instructions or components having more or less functionality than illustrated and described herein.

An exemplary computer program product includes, for example, one or more non-transitory computer-readable storage media having computer-executable components thereon. The computer-executable components include a definition component that when executed by a processor, such as processor 402 (shown in FIG. 4), causes the processor to define respective positions of a first set of nodes and a second set of nodes in an enrichment region. In an exemplary embodiment, the computer-executable components also include an analysis component that the processor to perform a coupled pore fluid diffusion and stress analysis on the enrichment region at the first set of nodes, determine whether the second set of nodes is activated as a result of the analysis, and visually output the results to a user.

In some embodiments, the definition component also causes the processor to define the enrichment region. Moreover, in some embodiments, definition component causes the processor to define an initial mesh of a crack within the enrichment region. Furthermore, in some embodiments, the definition component causes the processor to define crack initiation criteria and crack propagation criteria within the enrichment region.

In some embodiments, the analysis component causes the processor to define a fracture criterion based on properties of the enrichment region, and determine whether the fracture criterion is satisfied during the analysis. Moreover in some embodiments, the analysis component causes the processor to compute solutions to one or more equilibrium equations, wherein the one or more equilibrium equations are based on whether the second set of nodes is activated as a result of the analysis. Furthermore, in some embodiments, the analysis component causes the processor to model discontinuities in a fluid pressure field and fluid flow within the enrichment region.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-implemented method of modeling a hydraulically driven fracture comprising:
   selecting an enrichment region for modeling a subject hydraulically driven fracture, the enrichment region representing a permeable medium, and the modeling resulting in a model of the subject hydraulically driven fracture;
   defining respective positions of a first set of nodes and a second set of nodes in the enrichment region, wherein the second set of nodes are superposed on the first set of nodes;
   performing a coupled pore fluid diffusion and stress analysis on the enrichment region at the first set of nodes;
   determining whether the second set of nodes is activated as a result of the coupled pore fluid diffusion and stress analysis;
   computing solutions to one or more equilibrium equations, the one or more equilibrium equations based on whether the second set of nodes is activated as a result of the coupled pore fluid diffusion and stress analysis, wherein the one or more equilibrium equations define tangential fluid flow and normal fluid flow in the model of the subject hydraulically driven fracture; and
   visually outputting to a user a rendering of the model of the subject hydraulically driven fracture.

2. A computer-implemented method in accordance with claim 1, further comprising defining the enrichment region.

3. A computer-implemented method in accordance with claim 1, further comprising defining an initial crack using level node sets within the enrichment region.

4. A computer-implemented method in accordance with claim 1, further comprising defining crack initiation criteria and crack propagation criteria within the enrichment region, wherein crack initiation refers to the beginning of degradation of the cohesive response at an enriched element.

5. A computer-implemented method in accordance with claim 1, wherein determining whether the second set of nodes is activated comprises:
   defining a fracture criterion based on properties of the enrichment region; and
   determining whether the fracture criterion is satisfied as a result of the coupled pore fluid diffusion and stress analysis.

6. A computer-implemented method in accordance with claim 1, further comprising defining respective positions of an additional set of nodes on edges of the subject hydraulically driven fracture, the additional set of nodes being used to compute the one or more equilibrium equations.

7. A computer of modeling a hydraulically driven fracture comprising:
   a memory area configured to store:
   an enrichment region for modeling a subject hydraulically driven fracture, the enrichment region representing a permeable medium, and the modeling resulting in a model of the subject hydraulically driven fracture;
   respective positions of a first set of nodes and a second set of nodes in the enrichment region, wherein the second set of nodes are superposed on the first set of nodes; and
   a processor coupled to said memory area, said processor configured to:
   perform a coupled pore fluid diffusion and stress analysis on the enrichment region at the first set of nodes;
   determine whether the second set of nodes is activated as a result of the coupled pore fluid diffusion and stress analysis;
   compute solutions to one or more equilibrium equations, the one or more equilibrium equations based on whether the second set of nodes is activated as a result of the coupled pore fluid diffusion and stress analysis, wherein the one or more equilibrium equations define tangential fluid flow and normal fluid flow in the model of the subject hydraulically driven fracture; and
   visually output to a user a rendering of the model of the subject hydraulically driven fracture.

8. A computer in accordance with claim 7, wherein said processor is further configured to define the enrichment region.

9. A computer in accordance with claim 7, wherein said processor is further configured to define an initial crack using level node sets within the enrichment region.

10. A computer in accordance with claim 7, wherein said processor is further configured to define crack initiation criteria and crack propagation criteria within the enrichment region, wherein crack initiation refers to the beginning of degradation of the cohesive response at an enriched element.

11. A computer in accordance with claim 7, wherein said processor is further configured to:
define a fracture criterion based on properties of the enrichment region; and
determine whether the fracture criterion is satisfied as a result of the coupled pore fluid diffusion and stress analysis.

12. A computer in accordance with claim 7, wherein said processor is further configured to model discontinuities in a fluid pressure field and fluid flow within the enrichment region, wherein the fluid flow includes fluid leak-off.

13. A computer in accordance with claim 7, wherein said processor is further configured to define respective positions of an additional set of nodes on edges of the subject hydraulically driven fracture, the additional set of nodes being used to compute the one or more equilibrium equations.

14. A computer program product for modeling a hydraulically driven fracture comprising:
one or more non-transitory computer-readable storage media having computer-executable components thereon, said computer-executable components comprising:
a selection component that when executed by a processor causes the processor to select an enrichment region for modeling a subject hydraulically driven fracture, the enrichment region representing a permeable medium, and the modeling resulting in a model of the subject hydraulically driven fracture;
a definition component that when executed by the processor causes the processor to define respective positions of a first set of nodes and a second set of nodes in the enrichment region, wherein the second set of nodes are superposed on the first set of nodes; and
an analysis component that when executed by a processor causes the processor to:
perform a coupled pore fluid diffusion and stress analysis on the enrichment region at the first set of nodes;
determine whether the second set of nodes is activated as a result of the coupled pore fluid diffusion and stress analysis;
compute solutions to one or more equilibrium equations, the one or more equilibrium equations based on whether the second set of nodes is activated as a result of the coupled pore fluid diffusion and stress analysis, wherein the one or more equilibrium equations define tangential fluid flow and normal fluid flow in the model of the subject hydraulically driven fracture; and
visually output to a user a rendering of the model of the subject hydraulically driven fracture to a user.

15. A computer program product in accordance with claim 14, said definition component further causes the processor to define the enrichment region.

16. A computer program product in accordance with claim 14, said definition component further causes the processor to define an initial crack using level node sets within the enrichment region.

17. A computer program product in accordance with claim 14, said definition component further causes the processor to define crack initiation criteria and crack propagation criteria within the enrichment region, wherein crack initiation refers to the beginning of degradation of the cohesive response at an enriched element.

18. A computer program product in accordance with claim 14, wherein said analysis component further causes the processor to:
define a fracture criterion based on properties of the enrichment region; and
determine whether the fracture criterion is satisfied as a result of the coupled pore fluid diffusion and stress analysis.

19. A computer program product in accordance with claim 14, wherein said analysis component further causes the processor to model discontinuities in a fluid pressure field and fluid flow within the enrichment region, wherein the fluid flow includes fluid leak-off.

20. A computer program product in accordance with claim 14, wherein said definition component further causes the processor to define respective positions of an additional set of nodes on edges of the subject hydraulically driven fracture, the additional set of nodes being used to compute the one or more equilibrium equations.

* * * * *